US006957381B2

(12) United States Patent
Hessel (10) Patent No.: US 6,957,381 B2
(45) Date of Patent: Oct. 18, 2005

(54) SYSTEM AND METHOD FOR DETERMINING BRANCH METRICS USING A POLAR INDEXED BRANCH METRIC LOOK-UP TABLE

(75) Inventor: Clifford Hessel, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 485 days.

(21) Appl. No.: 10/211,555

(22) Filed: Aug. 5, 2002

(65) Prior Publication Data

US 2004/0025107 A1 Feb. 5, 2004

(51) Int. Cl.[7] .............................................. H03M 13/03
(52) U.S. Cl. ..................................................... 714/796
(58) Field of Search .............................. 714/791–795, 714/796; 375/262, 341, 265

(56) References Cited

U.S. PATENT DOCUMENTS 6,370,201 B1 * 4/2002 Abbaszadeh et al. ........ 375/262
6,424,685 B1 * 7/2002 Messel et al. ............... 375/341

OTHER PUBLICATIONS

Viterbi, A, Convolutional codes and their performance in communication systems, Oct. 1971, IEEE Trans. Comm. Technology, vol. COM19, No. 5, p. 751-772.*
Heller, J. A. et al., Viterbi decoding for satellite and space communication, Oct. 1971, IEEE Trans. COmm. Technology, vol. COM19, No. 5, p. 835-848.*
Viterbi, A. J. et al., Principles of digital communication and coding, 1979, McGraw-Hill Book Company, NY, p. 227-300 & 411-430.*
Hessel, C, High performance waveform, MIL-STD-188-181B and MIL-STD-188-184: their differences, similarities and applications,2001, IEEE, p. 14881494.*
Hessel et al., High speed data waveform over bandlimited channels, 1997, IEEE, p. 530-534.*
Hui-Ling Lou, Linear distance as branch metrics for Viterbi decoding of trellis codes, 2000, IEEE, p. 3267-3270.*
Kevin C. Kreitzer, Tracking parameter selection for MIL-STD-188-181B multi-H continuous phase modulation, 1999, IEEE, p. 1-5.*

* cited by examiner

Primary Examiner—Shelly Chase
(74) Attorney, Agent, or Firm—Duane Morris LLP (57) ABSTRACT

The present inventive system and method relate to the computation of branch metrics in Trellis Coded Modulation communication systems, specifically one that uses a Viterbi decoder. As described herein, the branch metrics are located in a look-up table which is indexed by at least one polar coordinate. The use of the look-up table relieves the computational burden of calculating branch metrics from the receiver processor thereby allowing the receiver to decode highly complex waveforms without an increase in processor computational capacity and attendant increase in power consumption. Angular offset values or polar coordinates that are otherwise calculated by the receiver processor are used to enter the look-up table and extract the appropriate branch metric for use by the Viterbi decoder. The inventive system and method can be used with any modulated digital signal and specifically can be used with a MIL-STD-188-181b signal.

50 Claims, 12 Drawing Sheets

SYSTEM AND METHOD FOR DETERMINING BRANCH METRICS USING A POLAR INDEXED BRANCH METRIC LOOK-UP TABLE

BACKGROUND OF THE INVENTION

The present invention relates to the computation of branch metrics in Trellis Coded Modulation ("TCM") communication systems. More specifically, the present invention relates to a computationally efficient, fast, and accurate way to calculate the branch metrics in a Viterbi decoder. The signal to be decoded can be any type of signal known in the art that uses TCM and/or Viterbi decoding. The present invention is ideally suited for satellite communication channels, for example channels employing MIL-STD-188-181b.

TCM and Viterbi decoders are well known in the art and have been described in detail in any number of books, papers, and articles, such as: Viterbi, A., "Convolutional Codes and Their Performance in Communication Systems,: *IEEE Trans. Commun. Technol.*, vol. COM19, no. 5, October 1971, pp. 751–772; Heller, J. A., and Jacobs, I. W., "Viterbi Decoding for Satellite and Space Communication," *IEEE Trans. Commun. Technol.*, vol. COM19, no. 5. October 1971, pp. 835–848; Viterbi, A. J., and Omura, J. K., *Principles of Digital Communication and Coding,* McGraw-Hill Book Company, New York, 1979; all of which are hereby incorporated herein by reference.

Generally, TCM combines coding and modulation together at the transmitter where the coding scheme used is typically a convolutional code. At the receiver, the decoding and demodulation are typically performed in a single step with the receiver having a priori knowledge of the encoder's structure. In a TCM system where each symbol is to transmit k bits, some number m of the least significant bits are sent to an encoder which outputs m+p bits to map into the waveform which has p possible symbols, where $p=2^{(k+p)}$. The m−k bits are not encoded. The number of possible states that the encoder may have is dependent on the constraint length of the code. In a trellis representation of the waveform, the uncoded bits are represented as parallel paths in the transitions between trellis states. For optimum demodulation of the TCM, the parallel paths are followed through the trellis. This dramatically complicates the decoding of the Trellis Codes compared to normal convolutional codes because branch metrics have to be computed for all the parallel paths, and the best parallel path needs to be stored for all surviving paths.

Generally, a Viterbi decoder performs maximum likelihood decoding but reduces the computational burden by taking advantage of the structure of the trellis. The decoder calculates the "distance", or branch metric, between the received signal at time $t_i$ and all the trellis paths entering each state at time $t_i$. The decoder eliminates those trellis paths that are not candidates for the maximum likelihood choice. When two paths enter the same state, the path with the best metric is chosen and the other path is discarded. Maximum likelihood decoding can equivalently be expressed as minimum distance decoding.

For trellis codes, the number of branch metrics that need to be calculated is a function of the complexity of the code. The more complex the code, the larger and more complicated the trellis, the more branch metrics need to be computed for any given state transition, and the higher the burden on the processor at the receiver. Additionally, the receiver processor may additionally be tasked with computations related to other functions, such as tracking algorithms.

Typical prior art solutions to the problem of processor burden include increasing the size and/or computational capacity and/or speed of the processor. However, these solutions have the disadvantage of requiring more power to drive the processor and therefore are not practical for power-limited devices, such as hand-held receivers or other devices that operate from battery power.

For example, the computation of branch metrics for a MIL-STD-188-181b signal requires 64 distance calculations on complex numbers at rates of up to 32 KHz per set. With the time and frequency tracking algorithms also running and the computations being handled by the same processor, the processor is likely to be strained and perhaps extended beyond its capacity to function in a timely manner.

One possibility for reducing the burden on the processor is to remove the branch metric calculations from the list of computations to be performed by the processor. The invention described herein reduces the processor burden by use of a look-up table for extracting the branch metric values. Specifically, the present inventive system and method uses a look-up table that is indexed with polar coordinates. In one embodiment, the polar coordinates for accessing the branch metric values in the look-up table may be obtained from an intermediate frequency application specific integrated circuit ("ASIC"). The ASIC may produce polar coordinates from the Cartesian coordinates of a symbol in the intermediate frequency signal. It is to be understood that the use of an ASIC to obtain the polar coordinates is just one exemplary method of producing the polar coordinates and that any method of producing polar coordinates of a received symbol, from an intermediate frequency or elsewhere, for use in accessing the branch metric values in the look-up table is contemplated by the present inventive system and method. The decoding algorithm itself can perform the access of the table on the fly, which significantly reduces the software complexity and further relieves the processor computational burden.

In one embodiment using a Minimum Distance Decoder, the look-up table contains all the possible distances for any received waveform relative to a reference waveform. When a symbol is received, that symbol is used to offset the index of the symbol represented by the state of the decoder. When the signal is close to the symbol corresponding to the decoder state, the offset index references distances of symbols that are close to the reference. These distances are typically small. Similarly, when the received signal is different from the state of the decoder, the index will reference large distances. In another embodiment using a Maximum Correlation Decoder, the same technique may be used by simply changing the generation of the look-up table, e.g., multiplying the Cartesian coordinates of the received symbol by the complex conjugate of the Cartesian coordinates of a reference point and extracting the real portion of the product. This technique will be discussed in more detail below.

Thus there is a need for determining branch metric values which can avoid the requirement of increasing the computational capacity and therefore the power consumption of the receiver processor.

Accordingly, it is an object of the present invention to obviate many of the above problems in the prior art and to provide a novel system and method for determining branch metric values without increasing the computational capacity and/or power consumption of the receiver processor.

It is another object of the present invention to provide a novel system and method for generating a branch metric look-up table indexed by polar coordinates.

It is yet another object of the present invention to provide a novel system and method for determining branch metric values for a phase shift keyed waveform.

It is still another object of the present invention to provide a novel system and method for determining branch metric values for a continuous phase modulated waveform.

It is a further object of the present invention to provide a novel system and method for determining branch metric values for a quadrature amplitude modulated waveform.

It is still a further object of the present invention to provide a novel system and method for determining branch metric values by defining a first locus of points as known candidate symbols and a second locus of points as potential received symbols and assigning a received symbol to the nearest potential received symbol point.

It is yet a further object of the present invention to provide a novel system and method for determining branch metric values for a Viterbi decoder by accessing a look-up table containing branch metric values for known candidate symbols and potential received symbols where the look-up table is indexed by a polar coordinate of the received symbol.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

With reference to the drawings, like numerals represent like components throughout the several drawings.

Figure 1A:
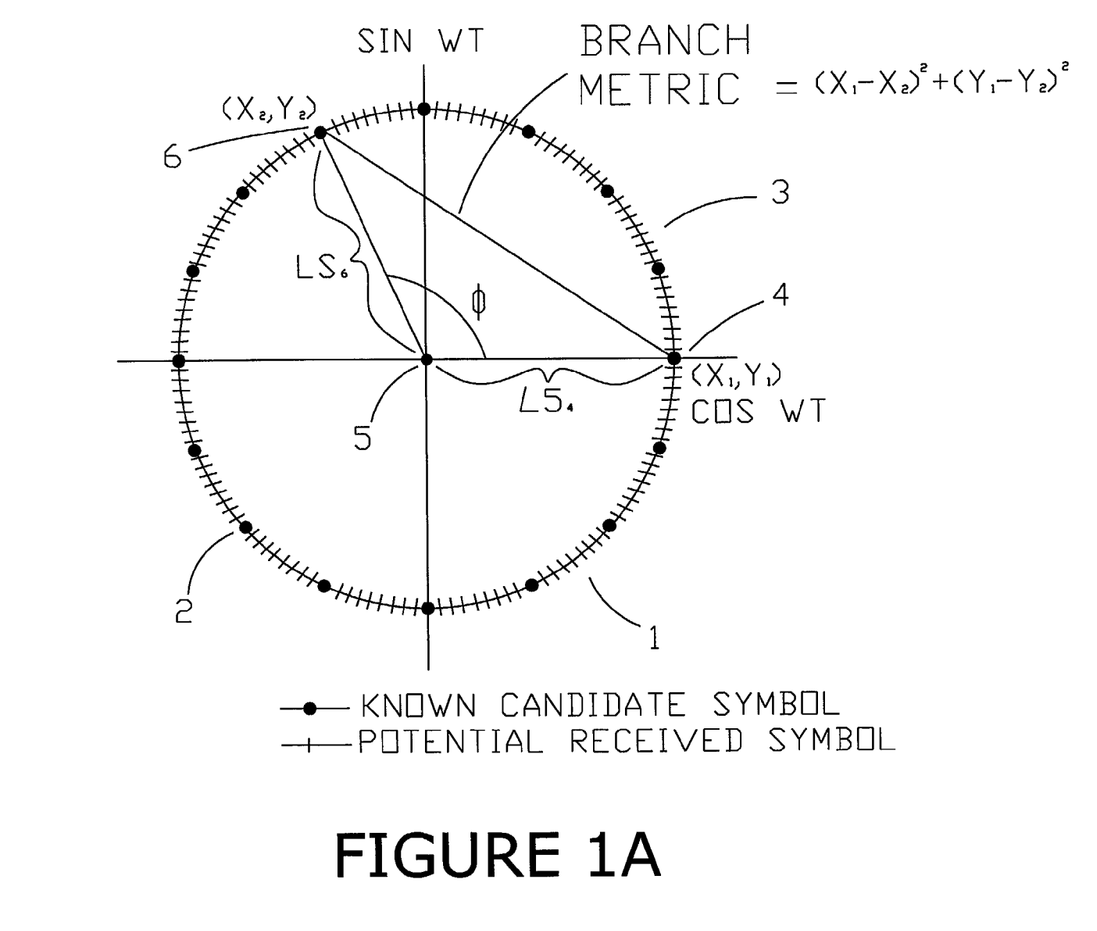
FIG. 1A is a depiction of a locus of points in a plane containing orthogonal axes, which may be a real (horizontal) axis and an imaginary (vertical) axis which may represent $\cos(\omega t)$ and $\sin(\omega t)$, respectively. The locus of points is comprised of known candidate symbols and potential received symbols of a communication system. The known candidate symbols represent the constellation signal space of the communication system. The potential received symbols represent the granularity of the system such that a received symbol is assigned to the closest potential received symbol. One known method for calculating the branch metric for each point on the plane can be accomplished by the equation shown.

FIG. 1A is a depiction of a locus of points 1 in a plane containing orthogonal axes, which, as is standard in the art, may represent $\cos(\omega t)$ and $\sin(\omega t)$ on the horizontal and vertical axis, respectively. The locus of points is comprised of the known candidate symbols 2 and the potential received symbols 3 of a communication system. Although the potential received symbols 3 are only shown partway around the locus of points 1 in FIG. 1A, one of skill in the art will understand that the potential received symbols 3 typically would be spaced throughout the entire locus of points 1. The known candidate symbols 2 represent the constellation signal space of the communication system. The potential received symbols 3 represent the granularity of the system such that a received symbol is assigned to the closest potential received symbol, i.e., it is assumed that the received symbol was received at the location for the closest potential received symbol. Since each of the known candidate symbols are ideally a received symbol, the set of potential received symbols typically includes all of the known candidate symbols.

FIG. 1A represents the constellation of symbols for a given amplitude and only one amplitude is shown for clarity. It is to be understood that concentric circles could be drawn to represent different amplitudes of signals with signals with larger amplitudes being located further from the center point of the constellation. Throughout the previous and following discussion, only a single amplitude will be discussed for ease of understanding the present invention although this is not meant to limit the invention in any way. Although the locus of points defined by the known candidate symbols can be depicted as a circle different than the locus of point as defined by the known potential received symbols, typically the two are depicted as one in the same. Additionally, while the present discussion is limited to sixteen known candidate symbols, one of skill in the art will understand that the same principles apply to communication systems with either more or less known candidate symbols. Furthermore, while the locus of points illustrated in the various Figures show known candidate symbols arranged about a circle, one of skill in the art will understand that the locus of points may take on any shape consistent with the constellation signal space of the communication system represented, such as, but not limited to, phase shift keying, quadrature amplitude modulation, or continuous phase modulation.

Typically, the known candidate symbols 2 and the potential received symbols 3 will form a single circle of points 1 on a plane containing orthogonal axes representing $\cos(\omega t)$ and $\sin(\omega t)$, i.e., the real and imaginary axes, respectively. As a practical matter, the number of potential received symbols is greater than or equal to the number of known candidate symbols since the number of potential received symbols usually defines the granularity of the system, i.e., how fine the circle of points 1 can be divided so as to minimize errors incurred by assigning a received symbol to the nearest potential received symbol position. A first reference point 4 is chosen on the circle which is preferentially the known candidate symbol on the positive real axis. A second reference point 5 is chosen and is typically the center of the aforesaid circle of points as the center is useful for determining angular offsets of the known candidate symbols and the potential received symbols from the first reference point. As shown in FIG. 1A, the angle $\phi$ is measured between the line segment $LS_6$ joining the symbol 6 at Cartesian coordinates $(x_2, y_2)$ and the second reference point 5 (at Cartesian coordinates $(0,0)$) and the line segment $LS_4$ joining the first reference point 4 at Cartesian coordinates $(x_1, y_1)$ and the second reference point 5. Any typical convention for measuring the angle $\phi$ can be used, such as measuring positive angles in a clockwise direction from the positive real axis or measuring positive angles in a counter-clockwise from the positive real axis. Additionally, symmetry allows for limiting the magnitude of the angle to 180°.

As shown in FIG. 1A, a branch metric can be calculated for each known candidate symbol and each potential received symbol since the locations of these points on the circle 1 is known. The branch metric may be determined a number of ways. For example, one way to determine the branch metric is by calculating the distance between a specific known candidate symbol 6 and the reference point 4 by the equation:

$$(x_1-x_2)^2+(y_1-y_2)^2$$

The branch metric in this example may also be calculated as a function of the difference of the value of the real coordinate of the reference point 4 and the known candidate symbol 6. Additionally, the angle $\phi$ between the line segment $LS_6$ and the line segment $LS_4$ is calculated by any appropriate method. The values for the branch metric of each known candidate symbol and each potential received symbol can be calculated and stored in a look-up table indexed by the appropriate associated angle $\phi$.

Figure 1B:
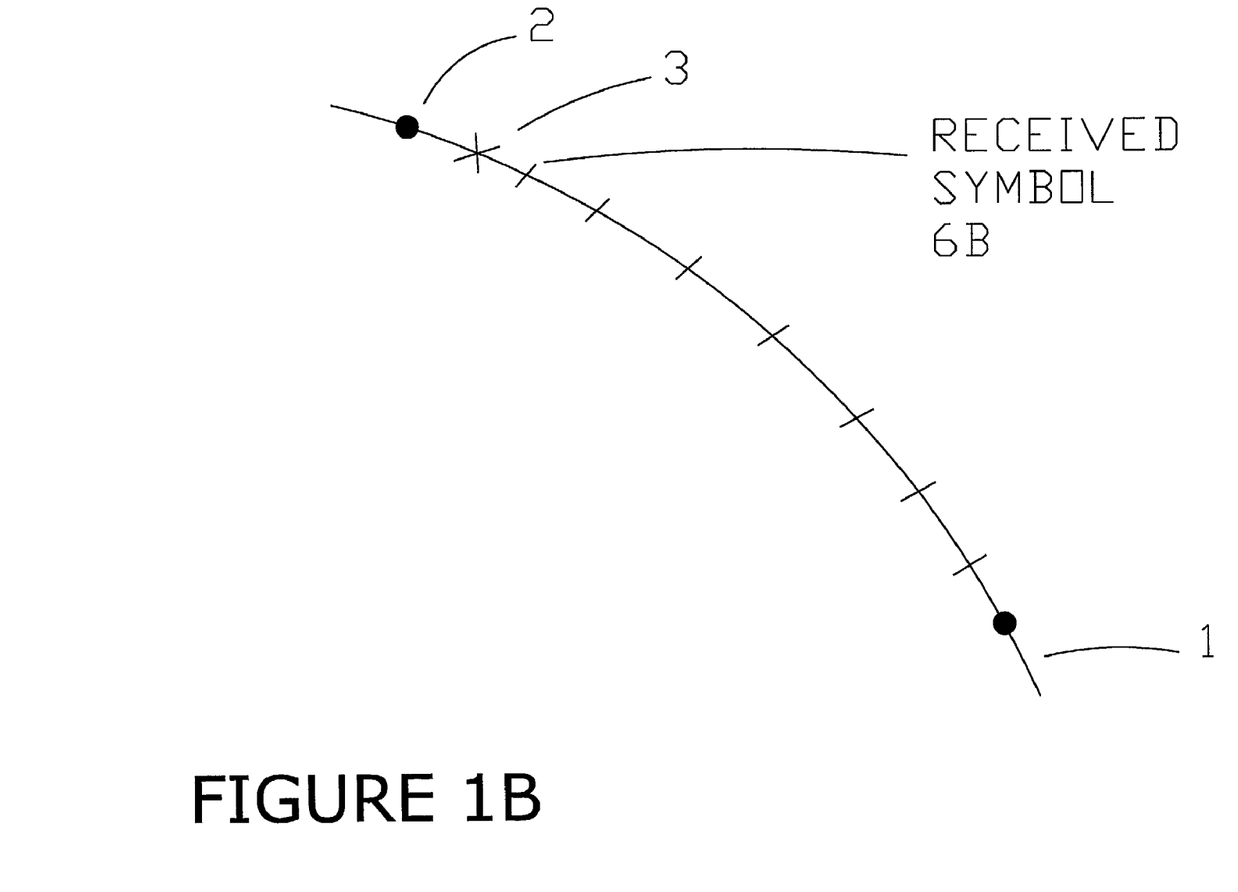
FIG. 1B is a depiction of a magnified portion of FIG. 1A and illustrates a received symbol not aligned with a potential received symbol point and therefore being assigned to the nearest potential received symbol point.

FIG. 1B is a magnified version of FIG. 1A and shows a portion of the locus of points 1, known candidate symbols 2, potential received symbols 3, and a received symbol 6B. The received symbol 6B is in a position on the locus of points 1 for which an exemplary actual received symbol may be placed. Note that the received symbol 6B is not coincident with a potential received symbol 3. Therefore, according to the present invention, the received symbol 6B is assigned to the nearest potential received symbol and treated as if the received symbol were actually received at a point coincident with the assigned potential received symbol. Any method for assigning the received symbol to the nearest potential received symbol is contemplated by the present invention including, but not limited to, smallest angular offset between the received symbol and a potential received symbol, smallest chord length between the received symbol and a potential received symbol, smallest difference in real coordinates between the received symbol and a potential received symbol, smallest difference in imaginary coordinates between the received symbol and a potential received symbol, smallest ratio of angular offset from a reference point for the received symbol and a potential received symbol, etc. Additionally, any combination of the above methods may be used for assigning the received symbol to a potential received symbol. The above methods are exemplary only and are not intended to limit the present invention in any way.

It would be obvious to one of skill in the art that the granularity of the potential received symbols can be improved by increasing the number of potential received symbols on the locus of points 1. Therefore, errors that may be introduced by assigning a received symbol to the nearest potential received symbol can be reduced. Naturally, the more potential received symbol points that exist, the larger the look-up table of branch metrics for the potential received symbols would need to be.

Figure 2:
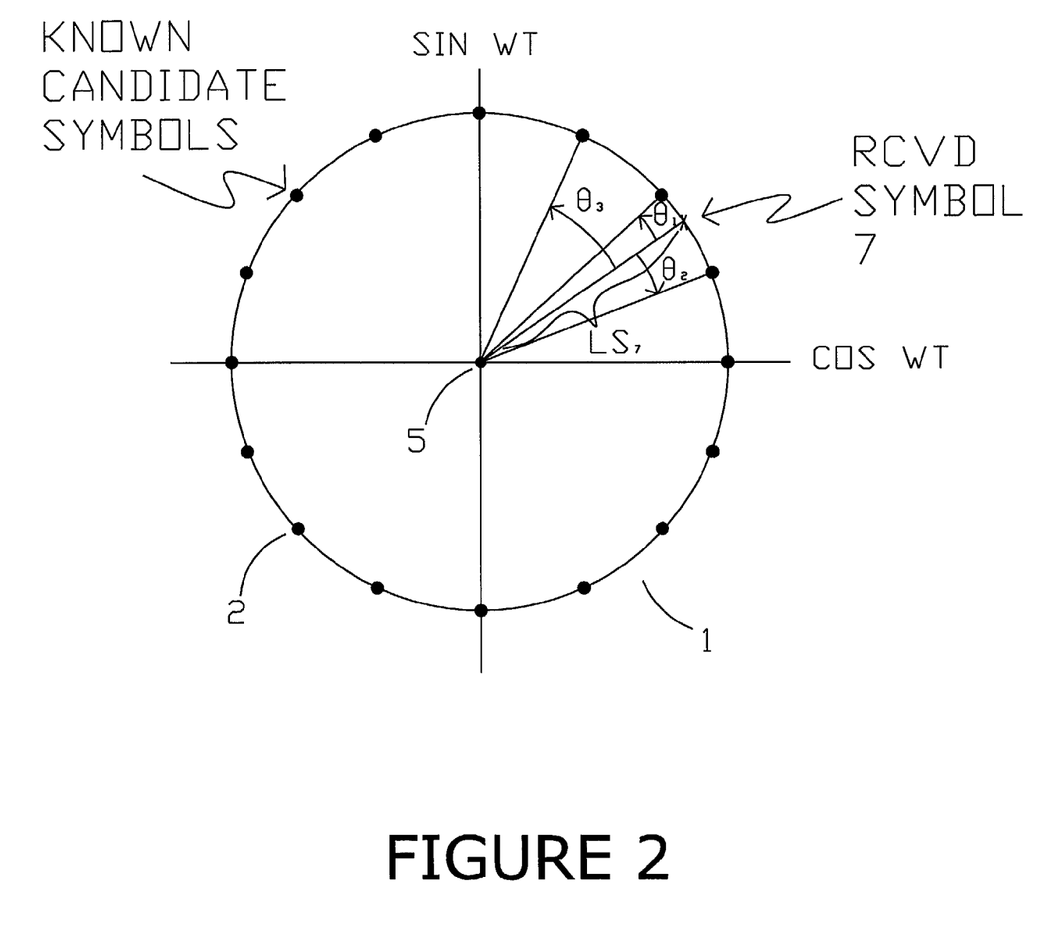
FIG. 2 is another depiction of a locus of points showing the angular offset between a received symbol and select ones of the known candidate symbols. Only three angular offsets are shown for clarity.

FIG. 2 is another depiction of a locus of points showing the angular offset $\theta_i$ between the received symbol 7 and select ones of the known candidate symbols 2 on the locus of points 1. The received symbol 7 shown in FIG. 2 is either directly on a potential received symbol point or has been moved to the closest potential received symbol point. Only three angular offsets are shown for clarity. The angular offsets are shown as measured from the line segment $LS_7$ to the line segments for the known candidate symbols. It should be obvious to one of skill in the art that any consistent scheme for measuring the angular offsets will do without changing the nature of the invention.

Figure 3:
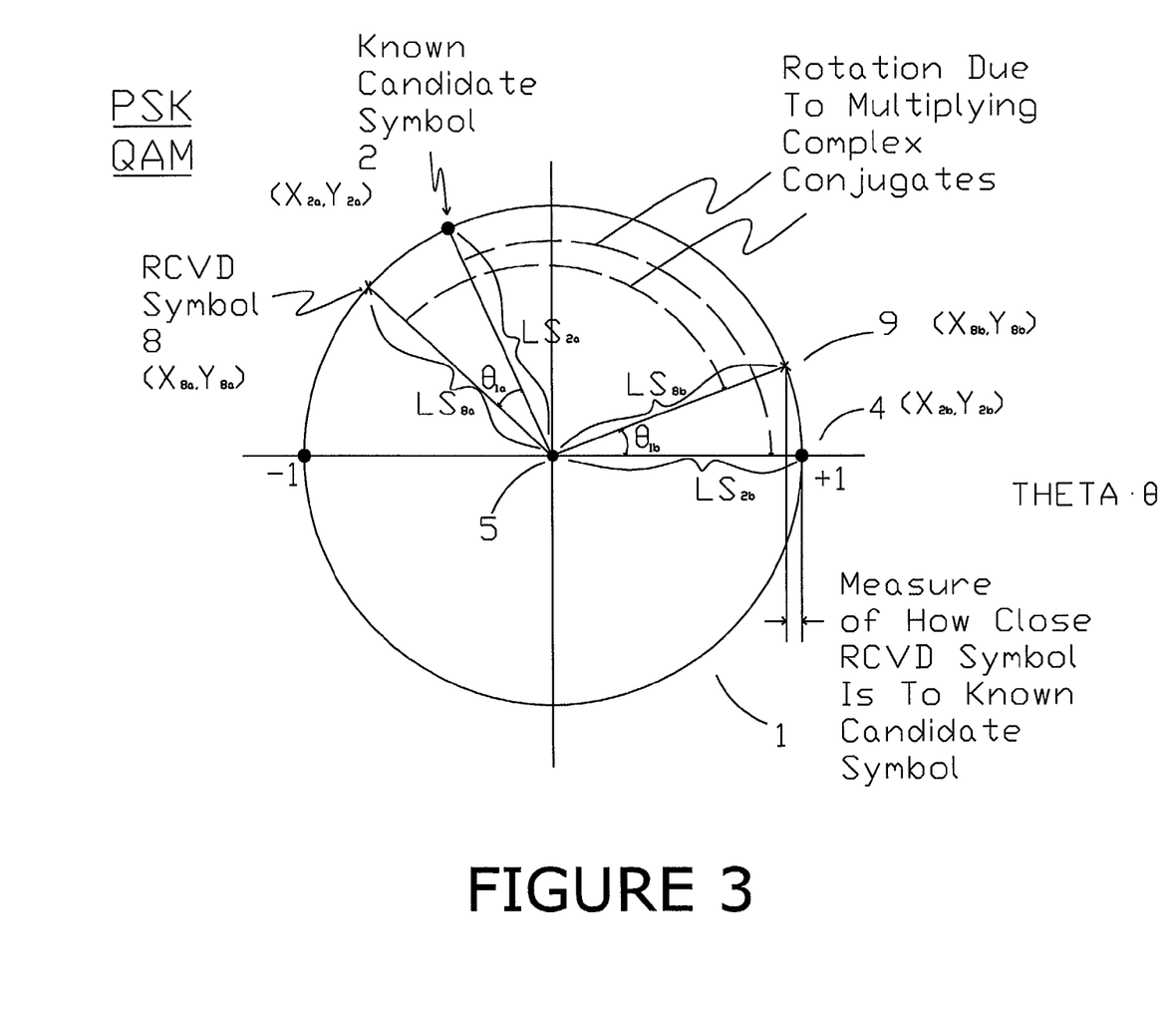
FIG. 3 is a depiction of a locus of points showing a known candidate symbol and a received symbol and the graphic effect of complex conjugate multiplication for a phase shift keyed ("PSK") signal or quadrature amplitude modulated ("QAM") signal for determining branch metrics.

FIG. 3 is a depiction of a locus of points 1 showing a known candidate symbol 2, a received symbol 8, the first reference point 4, the second reference point 5, the angular offset $\theta_{1a}$ and the angular offset $\theta_{1b}$. Another method for determining branch metrics for a phase shift keyed ("PSK") signal or quadrature amplitude modulated ("QAM") signal is herein provided. The symbol 8 is received and is assumed to be coincident with a potential received symbol at the position shown $(x_{8a}, y_{8a})$. The angle $\theta_{1a}$ is the angular offset of the received symbol 8 from the known candidate symbol 2 located at $(x_{2a}, y_{2a})$. Multiplication of the complex conjugates of the real coordinates of the received symbol $(x_{8a})$ and the known candidate symbol $(x_{2a})$ has the effect of rotating the position of the received symbol 8 and the known candidate symbol 2 to point 9 and point 4, respectively, as shown in FIG. 3. The angle $\theta_{1b}=\theta_{1a}$ The complex conjugate multiplication may take the form:

$$\mathrm{real}(x_{8a}{}^{\wedge}{}^*x_{2a}) \text{ or } \mathrm{real}(x_{8a}{}^*x_{2a}{}^{\wedge})$$

where $x_{8a}{}^{\wedge}$ denotes the conjugate of $x_{8a}$ and $x_{2a}{}^{\wedge}$ denotes the conjugate of $x_{2a}$. The branch metric may now be derived from the difference between the real coordinates of the rotated received symbol ($x_{8b}$) and the rotated known candidate symbol ($x_{2b}$).

Figure 4:
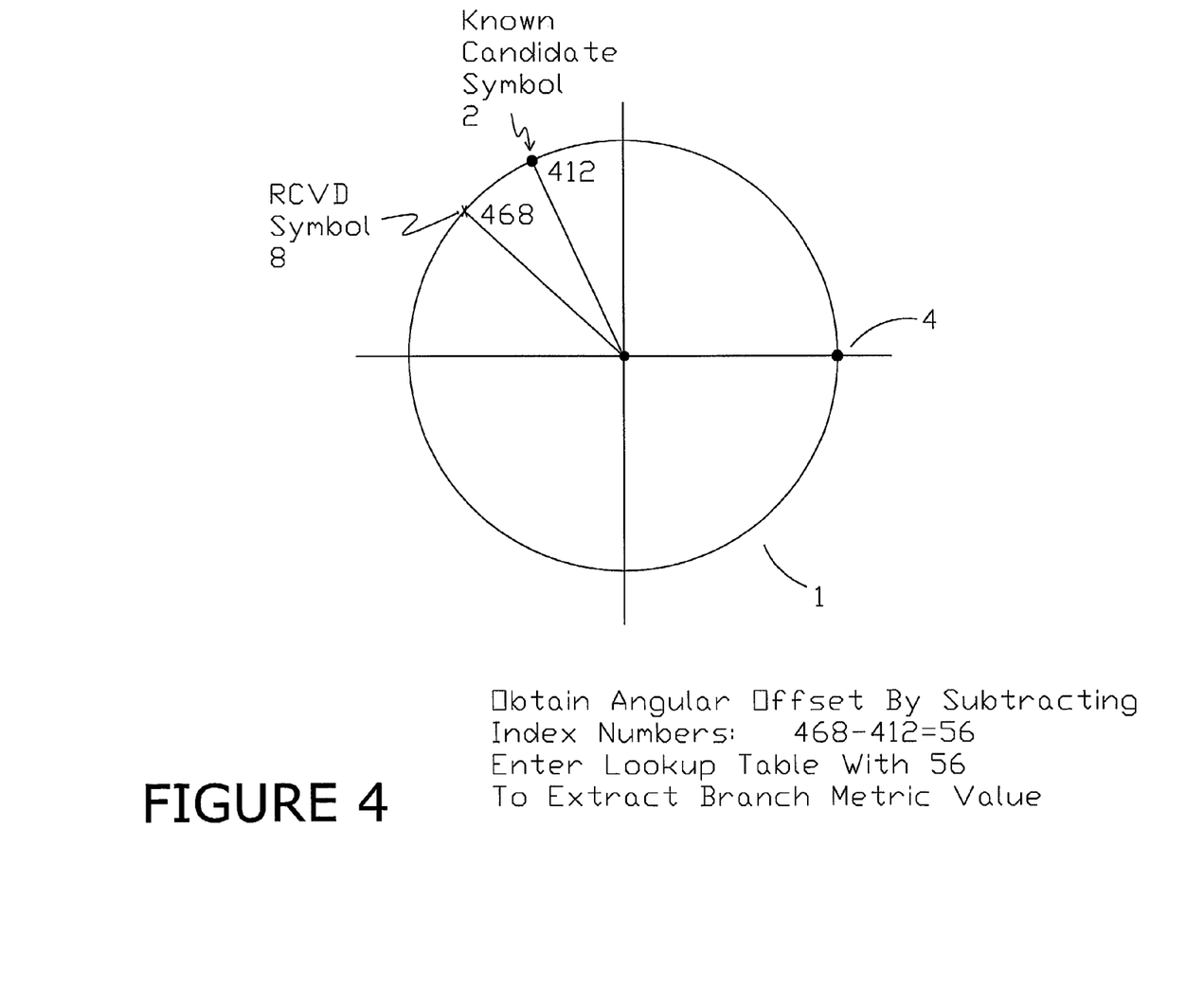
FIG. 4 is a depiction of a locus of points showing another method of obtaining the angular offset of a received symbol from a known candidate symbol.

Yet another method for determining the branch metric value of a received symbol is depicted in FIG. 4. A locus of points 1, a known candidate symbol 2, a first reference point 4, and a received symbol 8 (which is assumed to be coincident with a potential received symbol) are depicted. Each potential received symbol, and therefore each candidate received symbol, is assigned an index number which relates to the branch metric for that potential received symbol. The angular offset for the received symbol can be calculated by determining the difference between the index number of the received symbol and the candidate received symbol. This is analogous to the complex conjugate multiplication method described above. The angular offset can be used to enter a look-up table to extract the branch metric for the received symbol.

Figure 5:
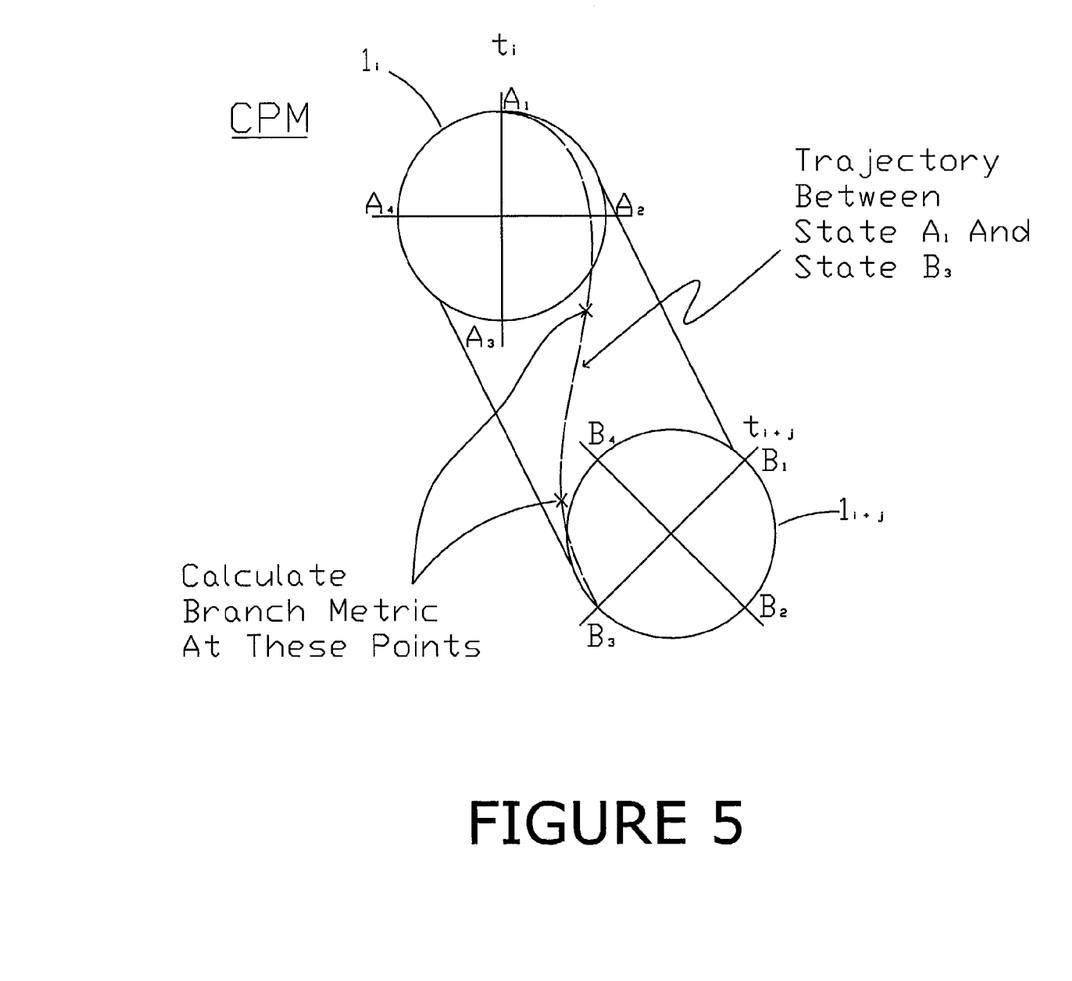
FIG. 5 is an expanded pictorial view of a continuous phase modulation ("CPM") signal trajectory from a first set of states $A_1$ through $A_4$ at time $t_i$ to a second set of states $B_1$ through $B_4$ at time $t_{i+j}$. Since the decoding of CPM signals requires not only information about the current state but also requires information about how the signal arrived at the current state, the branch metric must be calculated multiple times between states. While there would be sixteen trajectories between states $A_1$ through $A_4$ to states $B_1$ through $B_4$, only one trajectory is shown for clarity. Exemplary points for calculating the branch metric for the shown directory is indicated. As is known in the art, the branch metric may be calculated at other point(s) along the shown trajectory.

FIG. 5 is an expanded pictorial view of a continuous phase modulation ("CPM") signal trajectory from a first set of states $A_1$ through $A_4$ on the locus of points $1_i$ at a time $t_i$ to a second set of states $B_1$ through $B_4$ on the locus of points $1_{i+j}$ at a time $t_{i+j}$. The states $A_1$ through $A_4$ can be equated to the potential received symbols as described above. Only four are shown for clarity. Since the decoding of CPM signals requires not only information about the current state but also requires information about how the signal arrived at the current state, the branch metric must be calculated multiple times between states. While only 2 samples are shown for calculating the branch metric in FIG. 5, it is to be understood that more, or fewer, branch metrics can be calculated between the shown states. Obviously, the more samples and branch metrics taken, the more data must be handled and the more complicated the determination of the combined branch metric becomes. Additionally, the samples for the calculation of the branch metric do not necessarily have to be equidistant along the trajectory. The branch metrics can be calculated by any applicable method, such as by one or more of the methods described above.

Figure 6:
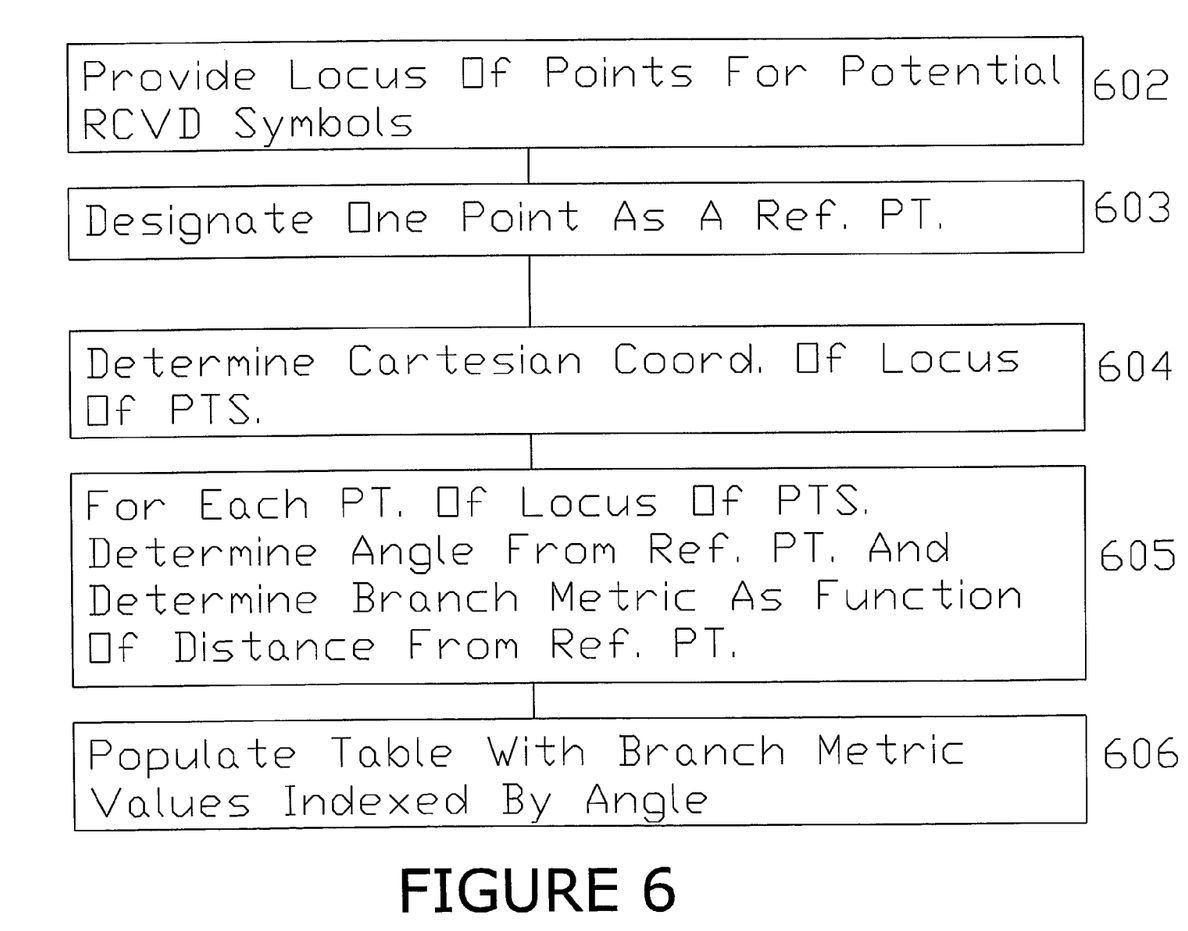
FIG. 6 is a flow chart showing the major steps required for an embodiment for creating a table of branch metric values indexed by angle as used in the present invention.

FIG. 6 is a flow chart showing the major steps required for one embodiment for creating a table of branch metric values indexed by angle as used in the present invention and as described above. In the step 602, a locus of points for the potential received symbols is provided, such as the potential received symbols 3 in FIG. 1A. The locus of points in the step 602 defines the granularity of the system and is independent of the modulation type for the received waveform. Therefore, the points representative of the known candidate symbols for a given waveform modulation type, e.g. the points 2 in FIG. 1A, may be coincident with ones of the locus of points in the step 602. However, this is not a requirement and should not be considered as a limitation of the invention. For the step 603, one of the potential received symbols is designated as a reference point, such as the point 4 in FIG. 1A, assuming for the purposes of this explanation that the point 4 in FIG. 1A is coincident with one of the potential received symbols 3 in FIG. 1A. Proceeding to the step 604 in FIG. 6, the Cartesian coordinates of the potential received symbols are determined. For the step 605, the angular position of each of the potential received symbols from the reference point is calculated and the branch metric for each of the potential received symbols is calculated by any method hereinbefore described or by any method known in the art. At the step 606, a look-up table is populated by the branch metrics for the potential received symbols determined in the step 605 and indexed by the corresponding angular offset of the potential received symbols determined in the step 605.

Figure 7:
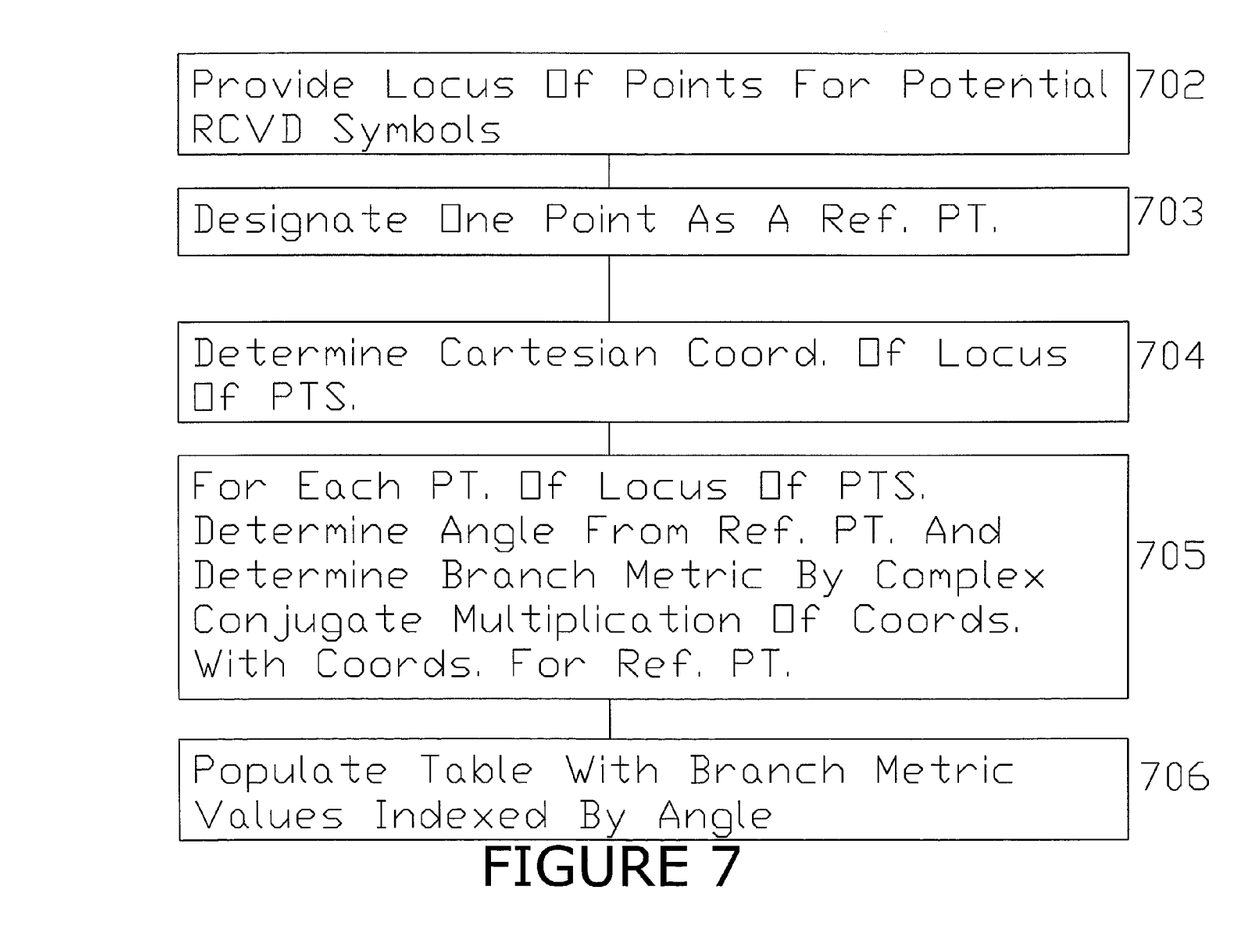
FIG. 7 is a flow chart showing the major steps required for a second embodiment for creating a table of branch metric values indexed by angle as used in the present invention.

FIG. 7 is a flow chart showing the major steps required for a second embodiment for creating a table of branch metric values indexed by angle as used in the present invention as described above. The steps 702 through 704 are similar to the steps 602 through 604, respectively, as described above for FIG. 6. For the step 705 of FIG. 7, the branch metric value for a potential received symbol is calculated relative to the reference point by complex conjugate multiplication as described above. The step 706 corresponds to the step 606 in FIG. 6: a look-up table is populated by the branch metrics for the potential received symbols determined in the step 705 and indexed by the corresponding angles determined in the steps 705.

Figure 8:
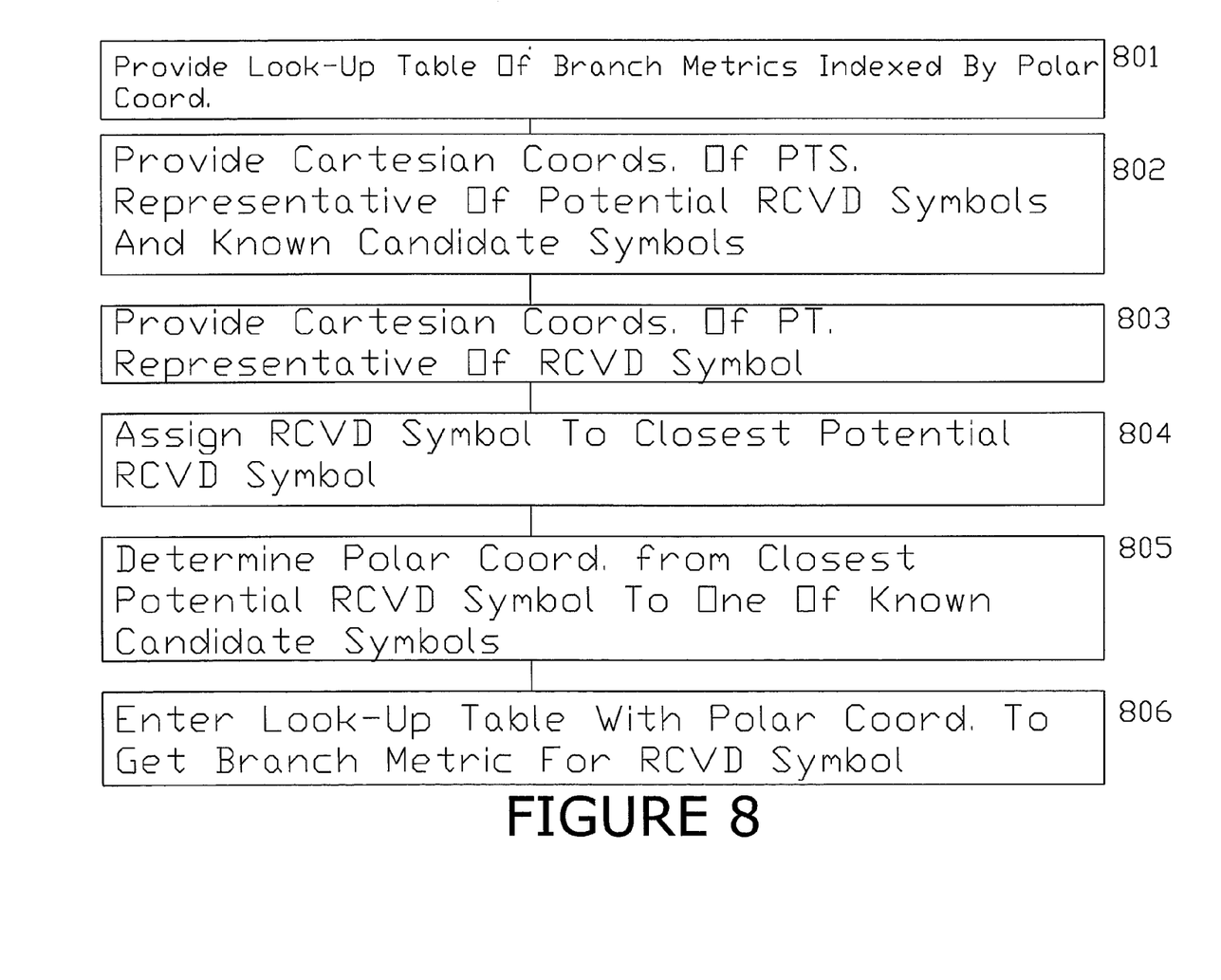
FIG. 8 is a flow chart showing the major steps for an embodiment of the present invention for obtaining the branch metric of a received symbol.

FIG. 8 is a flow chart showing the major steps for an embodiment of the present invention for obtaining the branch metric of a received symbol. At the step 801, a look-up table is provided which may be a look-up table created by one or more of the above-described methods. At the step 802, the Cartesian coordinates of points representative of potential received symbols and known candidate symbols is provided. This can be viewed as a mathematical abstraction of a plane with orthogonal axes and a first locus of points including the known candidate symbols a second locus of points including the potential received symbols such as shown in FIG. 1A. At the step 803, the Cartesian coordinates of point representative of a received symbol are provided. This point may also be viewed as a mathematical abstraction of a point on the plane described above and shown in FIG. 1A. At the step 804 the received symbol is assigned to the closest potential received symbol, since the locus of points representing the potential received symbols represents the granularity of the system. Going now to the step 805, a polar coordinate of the closest potential received symbol measured with respect to a one of the known candidate symbols is determined. At the step 806, the look-up table is entered with the polar coordinate for the closest received symbol and the branch metric for the received symbol is extracted.

Figure 9:
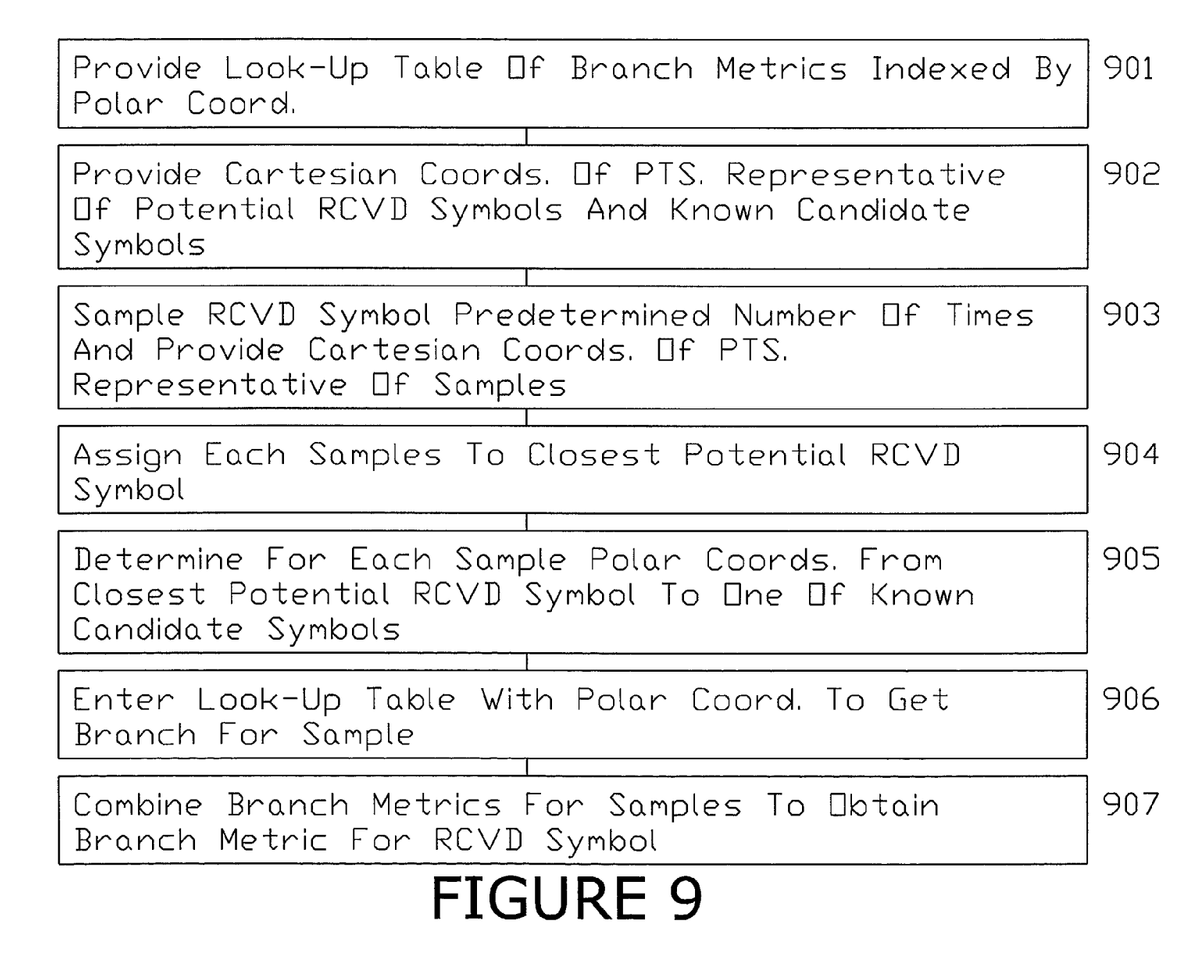
FIG. 9 is a flow chart showing the major steps for another embodiment of the present invention for obtaining the branch metric of a received symbol that is sampled plural times.

FIG. 9 is a flow chart showing the major steps for another embodiment of the present invention for obtaining the branch metric of a received symbol sampled plural times. The steps 901 and 902 correspond to the steps 801 and 802 as described above for FIG. 8. The step 903, the received symbol is sampled plural times and the Cartesian coordinates of the points representative of each of the samples are provided. These points may also be viewed as a mathematical abstraction of points on the plane described above and shown in FIG. 1A. At the step 904 the samples are each assigned to the respective closest potential received symbol, since the locus of points representing the potential received symbols represents the granularity of the system. Going now to the step 905, a polar coordinate of the respective closest potential received symbol for each sample is measured with respect to a one of the known candidate symbols. At the step 906, the look-up table is entered with the polar coordinate for the respective closest received symbol and the branch metric for each sample is extracted. At the step 907, the branch metrics of the samples are combined to thereby obtain the branch metric for the received symbol.

One of skill in the art would understand that for the explanation of FIG. 9 less than all the samples can be used to obtain the branch metric for the received symbol.

Figure 10:
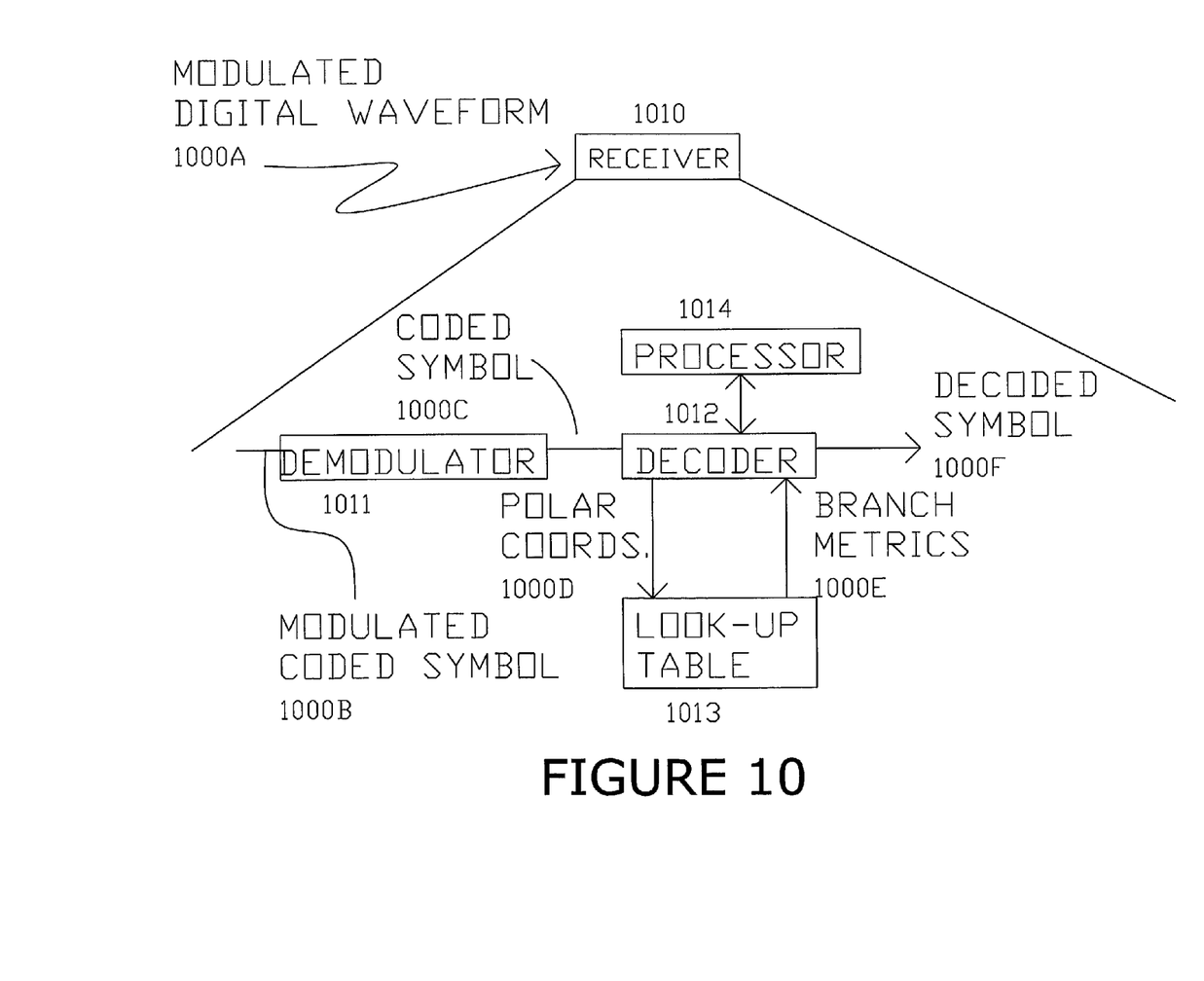
FIG. 10 is an illustration of a receiver according to the present invention showing a possible arrangement of the demodulator, decoder, look-up table, and processor. A modulated digital waveform is received by the receiver and the decoder outputs a decoded symbol from the modulated digital waveform.

FIG. 10 is an illustration of a receiver 1010 according to an embodiment of the present invention showing a possible arrangement of the demodulator 1011, the decoder 1012, the look-up table 1013, and the processor 1014. The look-up table is populated with branch metric values for the potential received symbols as described above. A modulated digital waveform 1000A is received by the receiver 1010 and a modulated coded symbol 1000B is applied to the demodulator 1011 which outputs a coded symbol 1000C to the decoder 1012. The decoder may, for instance, may provide polar coordinates 1000D to the look-up table 1013 which then provides the branch metric 1000E to the decoder. After a number of such operations, the decoder outputs the decoded symbol 1000F.

Figure 11:
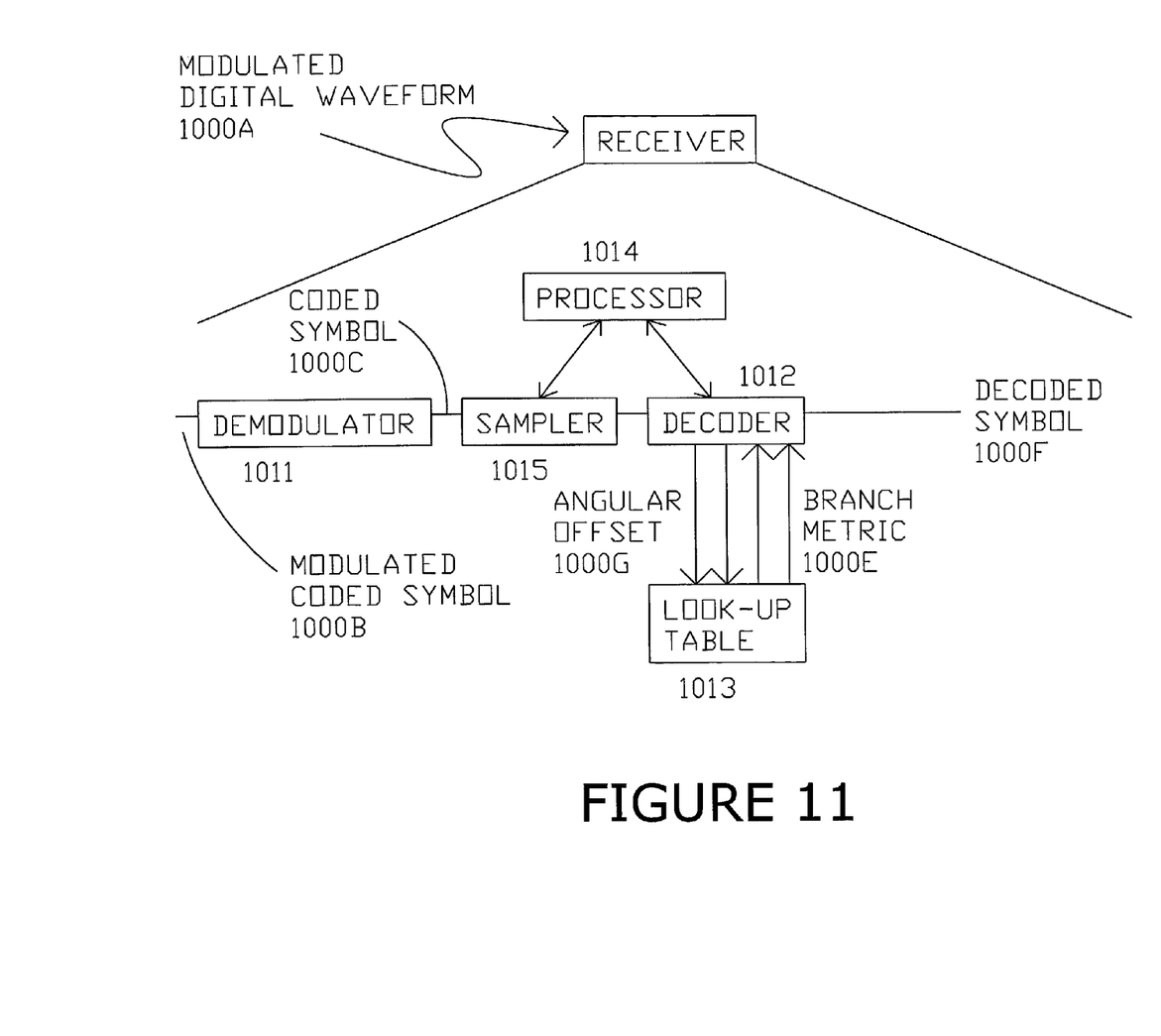
FIG. 11 is an illustration of a receiver according to the present invention showing a possible arrangement of the demodulator, sampler, decoder, look-up table, and processor. A modulated digital waveform is received by the receiver and the decoder outputs a decoded symbol from the modulated digital waveform. Note the multiple access lines from the decoder to/from the look-up table since the branch metric is calculated plural times for each symbol.

FIG. 11 is an illustration of a receiver according to an embodiment of the present invention similar to FIG. 10 with the addition of the sampler 1015 between the demodulator 1011 and the decoder 1012. The sampler 1015 is used for sampling a CPM waveform to thereby obtain multiple branch metrics as the waveform transitions from the locus of points $1_i$ to the locus of points $1_{i+j}$ as shown in FIG. 5. The look-up table is populated with branch metric values for the potential received symbols as described above. A modulated digital waveform 1000A is received by the receiver 1010 and a modulated coded symbol 1000B is applied to the demodulator 1011 which outputs a coded symbol 1000C to the sampler 1015 which provides samples of the coded symbol to the decoder 1012. The decoder, for instance, may provide polar coordinates 1000D to the look-up table 1013 for each of the samples. The look-up table provides the branch metric 1000E for each of the samples to the decoder 1012. After a number of such operations, the decoder outputs the decoded symbol 1000F.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A method for creating a look-up table to determine a branch metric of a received symbol of a modulated digital waveform wherein said received symbol is represented by a point on a plane comprising two orthogonal axes, said method comprising the steps of:
    (a) providing a locus of points on said plane representative of the set of potential received symbols;
    (b) designating one of the points of said locus of points as a first reference point;
    (c) providing a second reference point on said plane;
    (d) for each point of the locus of points:
        (i) determining the angle between a line connecting said point and said second reference point and a line connecting said second reference point and said first reference point; and
        (ii) calculating the branch metric value as a function of the distance between said point and said first reference point; and
    (e) populating a table with the branch metric values and indexing the table with the respective angle measurements to thereby create a look-up table.

2. The method of claim 1 wherein the branch metric value is determined as a function of the square of the distance between said point and said first reference point.

3. The method of claim 1 wherein the angle determined in step (d)(i) is less than or equal to 180 degrees and is positive when measured clockwise from the line connecting said point and said second reference point and negative when measured counter-clockwise from the line connecting said point and said second reference point.

4. The method of claim 1 wherein the angle determined in step (d)(i) is less than or equal to 180 degrees and is positive when measured counter-clockwise from the line connecting said point and said second reference point and negative when measured clockwise from the line connecting said point and said second reference point.

5. The method of claim 1 wherein the locus of points is approximately circular.

6. The method of claim 5 wherein the second reference point is located approximately in the center of the locus of points.

7. The method of claim 1 wherein steps (d) and (e) are replaced with the following steps:
    (d) determining the Cartesian coordinates of each point of the locus of points;
    (e) determining the angle between a line connecting a point of said locus of points and said second reference point and a line connecting said second reference point and said first reference point;
    (f) determining the branch metric value for a point of said locus of points as a function of the complex conjugate multiplication of the Cartesian coordinates of said point of said locus of points and the Cartesian coordinates of said first reference point;
    (g) repeating steps (e) and (f) for each point in said locus of points;
    (h) populating a table with the branch metric values determined in step (f) and indexing the table with the respective angle measurements determined in step (e) to thereby create a look-up table.

8. The method of claim 7 wherein the locus of points is approximately circular.

9. The method of claim 8 wherein the second reference point is located approximately in the center of the locus of points.

10. The method of claim 1 wherein steps (d) and (e) are replaced with the following steps:
    (d) for a first point of said locus of points:
        (i) determining the angle between a line connecting said first point and said second reference point and a line connecting said second reference point and said first reference point;
        (ii) calculating the branch metric value as a function of the distance between said first point and said first reference point;
    (e) for a second point of said locus of points:
        (i) determining the angle measured between a line connecting said second point and said second reference point and a line connecting said second reference point and said first reference point;
        (ii) calculating the branch metric value as a function of the distance between said second point and said first reference point;
    (f) calculating a combined branch metric value by adding the branch metric values calculated in step (d)(ii) and step (e)(ii);
    (g) repeating steps (d) through (f) for each point of said locus of points;
    (h) populating a table with the combined branch metric values calculated in step (f) and indexing the table with the two respective angle measurements associated with each combined branch metric value to thereby create a look-up table.

11. The method of claim 10 wherein the branch metric value is determined as a function of the square of the distance between said point and said first reference point.

12. The method of claim 10 wherein the angle determined in step (e)(i) is less than or equal to 180 degrees and is positive when measured clockwise from the line connecting said point and said second reference point and negative when measured counter-clockwise from the line connecting said point and said second reference point.

13. The method of claim 10 wherein the angle determined in step (e)(i) is less than or equal to 180 degrees and is positive when measured counter-clockwise from the line connecting said point and said second reference point and negative when measured clockwise from the line connecting said point and said second reference point.

14. The method of claim 10 wherein the locus of points is approximately circular.

15. The method of claim 14 wherein the second reference point is located approximately in the center of the locus of points.

16. A method for determining a branch metric value of a received symbol of a modulated digital waveform wherein said received symbol is represented by a point on a plane comprising two orthogonal axes and a first locus of points of known candidate symbols and a second locus of points of potential received symbols, said method comprising the steps of:
   (a) providing a look-up table of branch metric values for each of:
      (i) the potential received symbols each indexed by at least one polar coordinate of the respective potential received symbol, and
      (ii) the known candidate symbols each indexed by at least one polar coordinate of the respective known candidate symbol;
   (b) representing said received symbol as a point on said plane;
   (c) assigning the received symbol to the location on said plane of a closest potential received symbol;
   (d) determining at least one polar coordinate of said closest potential received symbol wherein said polar coordinate is measured relative to a one of said known candidate symbols;
   (e) entering said look-up table with said polar coordinate of said closest potential received symbol to thereby determine the branch metric value of said received symbol.

17. The method of claim 16 wherein the modulated digital waveform is a phase shift keyed waveform.

18. The method of claim 16 wherein the modulated digital waveform is a continuous phase modulated waveform.

19. The method of claim 16 wherein the modulated digital waveform is a quadrature amplitude modulated waveform.

20. The method of claim 16 wherein the branch metric values in the look-up table are calculated as a function of the distance from a reference point using Cartesian coordinates.

21. The method of claim 16 wherein the branch metric values in the look-up table are calculated as a function of the square of the distance from a reference point using Cartesian coordinates.

22. The method of claim 16 wherein the branch metric values in said look-up table are calculated by the complex conjugate multiplication of the Cartesian coordinates of said closest potential received symbol and the Cartesian coordinates of said one of said known candidate symbols.

23. A method for determining a branch metric value of a received symbol of a modulated digital waveform wherein said received symbol is sampled plural times and each sample is represented by a point on a plane comprising two orthogonal axes and a first locus of points of known candidate symbols and a second locus of points of potential received symbols, said method comprising the steps of:
   (a) providing a look-up table of branch metric values for each of:
      (i) the potential received symbols each indexed by at least one polar coordinate of the respective potential received symbol, and
      (ii) the known candidate symbols each indexed by at least one polar coordinate of the respective known candidate symbol;
   (b) sampling said received symbol and representing each said sample as a point on said plane;
   (c) assigning each sample to the location on said plane of a respective closest potential received symbol;
   (d) determining for each sample at least one polar coordinate of said respective closest potential received symbol wherein said polar coordinate is measured relative to a same one of said known candidate symbols;
   (e) entering said look-up table with said polar coordinate of said respective closest potential received symbol to thereby determine the branch metric value of said sample;
   (f) combining the branch metric values of a plurality of said samples for said received symbol to thereby determine the branch metric value for said received symbol.

24. The method of claim 23 wherein the step of determining at least one polar coordinate is accomplished by determining the angular offset of each respective closest potential received symbol from a same one of said known candidate symbols.

25. The method of claim 23 wherein the modulated digital waveform is a phase shift keyed waveform.

26. The method of claim 23 wherein the modulated digital waveform is a continuous phase modulated waveform.

27. The method of claim 23 wherein the modulated digital waveform is a quadrature amplitude modulated waveform.

28. The method of claim 23 wherein the branch metric values in the look-up table are calculated as a function of the distance from a reference point using Cartesian coordinates.

29. The method of claim 23 wherein the branch metric values in the look-up table are calculated as a function of the square of the distance from a reference point using Cartesian coordinates.

30. The method of claim 23 wherein the branch metric values in said look-up table are calculated by the complex conjugate multiplication of the Cartesian coordinates of said closest potential received symbol and the Cartesian coordinates of said one of said known candidate symbols.

31. A method for determining a branch metric value of a received symbol of a modulated digital waveform at a receiver,
   wherein said received symbol is represented by a point on a plane comprising two orthogonal axes including a first locus of points on said plane representative of a set of known candidate symbols and a second locus of points on said plane representative of a set of potential received symbols, and
   wherein said received symbol, said known candidate symbols, and said potential received symbols can each be located on said plane by Cartesian coordinates,
   said method comprising the steps of:
   (a) providing a look-up table of branch metric values indexed by at least one polar coordinate, said table comprising at least one of said plurality of known candidate symbols wherein at least one of said branch metric values is determined as a function of a complex conjugate multiplication of the Cartesian coordinates of a one of said plural candidate symbols and the Cartesian coordinates of a one of said plural potential received symbols;

(b) sampling said received symbol plural times and representing each sample as a point on said plane;

(c) assigning each sample to the location of a respective closest potential received symbol;

(d) determining for each of said respective closest potential received symbol an angular offset from the same one of said known candidate symbols;

(e) entering said look-up table with the angular offset for each sample to thereby determine the branch metric values for each sample; and (f) combining the branch metric values for each sample to thereby determine the branch metric value of the received symbol.

32. The method of claim 31 wherein steps (d) through (f) are repeated for a plurality of said known candidate symbols.

33. The method of claim 31 wherein steps (d) through (f) are repeated for all of said known candidate symbols.

34. The method of claim 31 wherein the modulated digital waveform is a phase shift keyed waveform.

35. The method of claim 31 wherein the modulated digital waveform is a continuous phase modulated waveform.

36. The method of claim 31 wherein the modulated digital waveform is a quadrature amplitude modulated waveform.

37. The method of claim 31 wherein the branch metric values in the look-up table are calculated as a function of the distance from a reference point using Cartesian coordinates.

38. The method of claim 31 wherein the branch metric values in the look-up table are calculated as a function of the square of the distance from a reference point using Cartesian coordinates.

39. A system for determining a branch metric value of a received symbol of a modulated digital waveform wherein said received symbol is represented by a point on a plane comprising two orthogonal axes and a first locus of points of known candidate symbols and a second locus of points of potential received symbols, said system comprising the steps of:

(a) a look-up table of branch metric values for each of:
  (i) the potential received symbols each indexed by at least one polar coordinate of the respective potential received symbol, and
  (ii) the known candidate symbols each indexed by at least one polar coordinate of the respective known candidate symbol;

(b) means for representing said received symbol as a point on said plane;

(c) means for assigning the received symbol to the location on said plane of a closest potential received symbol;

(d) means for determining at least one polar coordinate of said closest potential received symbol wherein said polar coordinate is measured relative to a one of said known candidate symbols;

(e) means for entering said look-up table with said polar coordinate of said closest potential received symbol to thereby determine the branch metric value of said received symbol.

40. The system of claim 39 wherein the modulated digital waveform is a phase shift keyed waveform.

41. The system of claim 39 wherein the modulated digital waveform is a continuous phase modulated waveform.

42. The system of claim 39 wherein the modulated digital waveform is a quadrature amplitude modulated waveform.

43. The system of claim 39 wherein the branch metric values in the look-up table are calculated as a function of the distance from a reference point using Cartesian coordinates.

44. The system of claim 39 wherein the branch metric values in the look-up table are calculated as a function of the square of the distance from a reference point using Cartesian coordinates.

45. A system for determining a branch metric value of a received symbol of a modulated digital waveform at a receiver, wherein said received symbol is represented by a point on a plane comprising two orthogonal axes including a first locus of points on said plane representative of a set of known candidate symbols and a second locus of points on said plane representative of a set of potential received symbols, and wherein said received symbol, said known candidate symbols, and said potential received symbols can each be located on said plane by Cartesian coordinates, said system comprising the steps of:

(a) a look-up table of branch metric values indexed by at least one polar coordinate, said table comprising at least one of said plurality of known candidate symbols wherein at least one of said branch metric values is determined as a function of a complex conjugate multiplication of the Cartesian coordinates of a one of said plural candidate symbols and the Cartesian coordinates of a one of said plural potential received symbols;

(b) means for sampling said received symbol plural times and representing each sample as a point on said plane;

(c) means for assigning each sample to the location of a respective closest potential received symbol;

(d) means for determining for each of said respective closest potential received symbol an angular offset from the same one of said known candidate symbols;

(e) means for entering said look-up table with the angular offset for each sample to thereby determine the branch metric values for each sample; and (f) means for combining the branch metric values for each sample to thereby determine the branch metric value of the received symbol.

46. The system of claim 45 wherein the modulated digital waveform is a phase shift keyed waveform.

47. The system of claim 45 wherein the modulated digital waveform is a continuous phase modulated waveform.

48. The system of claim 45 wherein the modulated digital waveform is a quadrature amplitude modulated waveform.

49. The system of claim 45 wherein the branch metric values in the look-up table are calculated as a function of the distance from a reference point using Cartesian coordinates.

50. The system of claim 45 wherein the branch metric values in the look-up table are calculated as a function of the square of the distance from a reference point using Cartesian coordinates.

* * * * *